(12) United States Patent
Chillarige et al.

(10) Patent No.: US 10,180,457 B1
(45) Date of Patent: Jan. 15, 2019

(54) SYSTEM AND METHOD PERFORMING SCAN CHAIN DIAGNOSIS OF AN ELECTRONIC DESIGN

(71) Applicant: Cadence Design Systems, Inc., San Jose, CA (US)

(72) Inventors: Sameer Chakravarthy Chillarige, Uttar Pradesh (IN); Sharjinder Singh, Delhi (IN); Anil Malik, Delhi (IN); Joseph Michael Swenton, Owego, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 67 days.

(21) Appl. No.: 15/062,013

(22) Filed: Mar. 4, 2016

(51) Int. Cl.
*G01R 31/317* (2006.01)
*G01R 31/3177* (2006.01)
*G06F 17/50* (2006.01)
*G01R 31/00* (2006.01)
*G01R 31/311* (2006.01)

(52) U.S. Cl.
CPC ... *G01R 31/31704* (2013.01); *G01R 31/3177* (2013.01); *G01R 31/00* (2013.01); *G01R 31/311* (2013.01); *G06F 17/50* (2013.01); *G06F 17/5022* (2013.01); *G06F 17/5045* (2013.01)

(58) Field of Classification Search
CPC .... G01R 31/318563; G01R 31/318335; G01R 31/318544; G01R 31/318586; G01R 31/318541; G01R 31/31704; G01R 31/31707; G01R 31/3177; G01R 31/31835; G06F 17/5045; G06F 17/5022; G06F 17/50; G06F 2217/70; G06F 11/2215
See application file for complete search history.

(56) References Cited

U.S. PATENT DOCUMENTS

| | | | | |
|---|---|---|---|---|
| 6,795,944 B2* | 9/2004 | Barnhart | ........ | G01R 31/318563 714/726 |
| 7,496,816 B2* | 2/2009 | Bartenstein | .... | G01R 31/318566 714/726 |
| 7,509,546 B2* | 3/2009 | Rajski | ............ | G01R 31/318335 714/718 |
| 7,574,644 B2* | 8/2009 | Forlenza | ........ | G01R 31/318586 714/21 |
| 7,581,149 B2* | 8/2009 | Sugawara | ...... | G01R 31/318536 714/726 |
| 7,788,561 B2* | 8/2010 | Huang | ........... | G01R 31/318569 702/183 |

(Continued)

*Primary Examiner* — Helen Rossoshek
(74) *Attorney, Agent, or Firm* — Mark H. Whittenberger, Esq.; Holland & Knight LLP

(57) ABSTRACT

The present disclosure relates to a system and method for performing scan chain diagnosis of an electronic design. The method may include identifying, at a computing device, at least one failing scan chain associated with the electronic design. The method may also include selecting a plurality of defect locations associated with the at least one failing scan chain, wherein the plurality of defect locations corresponds to a number of parallel patterns that a simulator is configured to process. The method may further include selecting a sliced failing pattern set and generating a plurality of copies of a pattern associated with the sliced failing pattern set, wherein each of the plurality of copies corresponds to one of the plurality of defect locations. The method may also include simulating the plurality of copies of the pattern in parallel.

18 Claims, 9 Drawing Sheets

(56) References Cited

U.S. PATENT DOCUMENTS

| | | | | |
|---|---|---|---|---|
| 7,840,865 B2* | 11/2010 | Lai | ................. | G01B 31/318547 |
| | | | | 714/728 |
| 8,006,150 B2* | 8/2011 | Sinanoglu | ...... | G01R 31/318547 |
| | | | | 714/726 |
| 8,046,653 B2* | 10/2011 | Rajski | ............ | G01R 31/318335 |
| | | | | 714/732 |
| 8,595,574 B2* | 11/2013 | Huang | ........... | G01B 31/318569 |
| | | | | 714/724 |
| 8,607,107 B2* | 12/2013 | Cheng | ............ | G01R 31/318563 |
| | | | | 714/729 |
| 8,650,524 B1* | 2/2014 | Chakravadhanula | ........................ | |
| | | | | G06F 17/505 |
| | | | | 716/106 |
| 2005/0125755 A1* | 6/2005 | Lu | .................. | G01R 31/318328 |
| | | | | 716/113 |
| 2005/0289419 A1* | 12/2005 | Okano | ............. | G01R 31/31813 |
| | | | | 714/726 |
| 2006/0053357 A1* | 3/2006 | Rajski | .................... | G01R 31/01 |
| | | | | 714/742 |
| 2006/0111873 A1* | 5/2006 | Huang | ........... | G01R 31/318547 |
| | | | | 702/185 |
| 2008/0040637 A1* | 2/2008 | Huang | ........... | G01B 31/318569 |
| | | | | 714/729 |
| 2014/0164859 A1* | 6/2014 | Huang | ........... | G01R 31/318541 |
| | | | | 714/727 |
| 2015/0285859 A1* | 10/2015 | Jajodia | ............... | G01R 31/3187 |
| | | | | 714/727 |
| 2017/0010325 A1* | 1/2017 | Subbarayan | ..... | G01R 31/31835 |

* cited by examiner

| Design | Defect Type | #Failing Patterns | #Simulations (Existing approach) | #Simulations (New approach) | Performance Improvement | Top Score (Existing Approach) | Top Score (New Approach) |
|---|---|---|---|---|---|---|---|
| Des1 | Stuck1 | 22 | 1320 | 208 | 6.34X | 100 | 100 |
| Des2 | Stuck0 | 34 | 3060 | 656 | 4.66X | 100 | 100 |
| Des3 | Intermittent Hold Time | 31 | 5712 | 870 | 6.56X | 98.4 | 99.3 |

FIG. 9

SYSTEM AND METHOD PERFORMING SCAN CHAIN DIAGNOSIS OF AN ELECTRONIC DESIGN

FIELD OF THE INVENTION

The present disclosure relates to the field of integrated circuit analysis. More particularly, the present disclosure relates to integrated circuit defect analysis.

DISCUSSION OF THE RELATED ART

Integrated circuit (IC) design is a laborious and complex process that involves iterations of design development and takes into account a large number of constraints (e.g., power requirements, processing requirements, etc.). To facilitate the design process, computer modeling of the IC is commonly performed to study various performance characteristics of the proposed design. Even with a perfect design, however, the manufactured IC corresponding to the design may be less than perfect. Deviations between the design and manufactured versions of the IC may arise due to one or more factors, such as, a defect in the manufacturing process, a defect in the manufacture of a particular IC, manufacturing limitation(s) unforeseen during the design process, or real world limitations (e.g., material characteristics).

Depending on the defect, it is possible that even a single defect in a manufactured IC may render the entire IC defective. With present ICs containing upwards of billions of devices (e.g., resisters, capacitors, inductors, transistors, diodes, flip flops, etc.) along with the necessary connections therebetween to operate in a desired manner, identifying the source(s) of the defect within the IC is no easy task. One way to enable testing of manufactured ICs (to determine IC defects) is to include design for test (DFT) structures in the IC during the design process.

An example of DFT structures included in an IC is scan chains. A scan chain may include flip flops (or other sequential devices) serially connected to each other, the output of one flip flop being the input of the next flip flop in the series. One or more such scan chains can be included in an IC. For each manufactured IC, an IC tester loads a pre-determined test pattern to each scan chain of the manufactured IC and correspondingly reads out a unload pattern from each scan chain. This is referred to as a scan test. One or more pre-determined test patterns may be inputted to each scan chain for the scan test. An unload pattern from a particular scan chain that differs from an expected pattern indicates the presence of a defect within that scan chain.

For each scan chain in which its unload pattern differs from the expected pattern, the next step is to determine the location of the failure. Scan chain diagnostics are used to identify the exact location in the failing scan chain. Performing scan chain diagnostics uses the fail data collected from the IC tester to narrow down the failure location. Ideally the scan chain diagnostics should pinpoint the exact flip flop(s) within a scan chain that is defective. In practice, however, diagnosis of the scan chain defect is less precise.

Typically, any of a number of flip flops in a scan chain may be diagnosed as being defective, rather than a specific flip flop in the scan chain. The inability to pinpoint a particular flip flop may occur due to insufficiency of the test data. Another cause may be due to the IC design itself—the design making it difficult to distinguish between two bit positions of the flip flops or certain bit positions in a scan chain that cannot be diagnosed. Because scan chain diagnosis identifies the failing flip flop(s) based on those flip flop(s) with the highest failure probability (e.g., weighted binary determination), the locations of flip flops dictated by the IC design can limit the ability to pinpoint a particular flip flop.

Diagnosis of scan chain defects is also computationally intensive. It requires performing circuit simulations using numerous pre-determined test patterns, analyzing the corresponding unload patterns, and iteratively adjusting the circuit simulation in an attempt to match the (fail) test data from the manufactured IC to those observed in the circuit simulations. Since each manufactured IC is tested and it can contain more than one scan chain, in volume diagnostic mode, this can be a high computational load.

SUMMARY

In an embodiment of the present disclosure a method for performing scan chain diagnosis of an electronic design is provided. The method may include identifying, at a computing device, at least one failing scan chain associated with the electronic design and selecting a plurality of defect locations associated with the at least one failing scan chain, wherein the plurality of defect locations corresponds to a number of parallel patterns that a simulator is configured to process. The method may further include selecting a sliced failing pattern set and generating a plurality of copies of a pattern associated with the sliced failing pattern set, wherein each of the plurality of copies corresponds to one of the plurality of defect locations. For each of the plurality of copies, the method may include modifying a load value according to the defect location assumed for the copied pattern. The method may also include simulating each of the plurality of copies in parallel and obtaining a diagnosis score for all assumed defective locations and iteratively repeating the simulating and obtaining for all possible defective locations. The method may further include identifying one or more best scoring locations, selecting a second sliced failing pattern set and generating a second plurality of copies of a pattern associated with the second sliced failing pattern set. The method may include simulating the second plurality of copies of the pattern in parallel.

One or more of the following features may be included. In some embodiments, the selected sliced failing pattern set may be a subset of all failing patterns of the electronic design. In some embodiments, iteratively repeating simulating and obtaining may generate a pruned list of possible defective locations. The method may include storing machine word size data at each node of the electronic design, wherein each bit in a machine word includes a value of a node in a pattern.

In another embodiment of the present disclosure a method for performing scan chain diagnosis of an electronic design. The method may include identifying, at a computing device, at least one failing scan chain associated with the electronic design. The method may also include selecting a plurality of defect locations associated with the at least one failing scan chain, wherein the plurality of defect locations corresponds to a number of parallel patterns that a simulator is configured to process. The method may further include selecting a sliced failing pattern set and generating a plurality of copies of a pattern associated with the sliced failing pattern set, wherein each of the plurality of copies corresponds to one of the plurality of defect locations. The method may also include simulating the plurality of copies of the pattern in parallel.

One or more of the following features may be included. In some embodiments, the method may include storing machine word size data at each node of an electronic design, wherein each bit in a machine word includes a value of a node in a pattern. The selected sliced failing pattern set may be a subset of all failing patterns of the electronic design. For each of the plurality of copies of the pattern, the method may include modifying a load value according to the defect location assumed for the copied pattern. The method may also include obtaining one or more diagnosis scores for each of the plurality of defect locations, identifying at least one flop having a low diagnosis score and eliminating the at least one flop from a simulation. Simulating may include all defect locations associated with the electronic design. The method may include selecting a second sliced failing pattern set and generating a second plurality of copies of a pattern associated with the second sliced failing pattern set and simulating the second plurality of copies of the pattern in parallel. The method may include obtaining one or more simulation scores and identifying a defect location based upon, at least in part, a maximum score.

In another embodiment of the present disclosure a system for performing scan chain diagnosis of an electronic design is provided. The system may include a computing device including at least one processor configured to perform one or more operations. The at least one processor may be configured to identify at least one failing scan chain associated with the electronic design and select a plurality of defect locations associated with the at least one failing scan chain, wherein the plurality of defect locations corresponds to a number of parallel patterns that a simulator is configured to process. The at least one processor may be configured to select a sliced failing pattern set and generate a plurality of copies of a pattern associated with the sliced failing pattern set, wherein each of the plurality of copies corresponds to one of the plurality of defect locations. The at least one processor may be configured to simulate the plurality of copies of the pattern in parallel.

In some embodiments, the computing device may be configured to store machine word size data at each node of an electronic design, wherein each bit in a machine word includes a value of a node in a pattern. The selected sliced failing pattern set is a subset of all failing patterns of the electronic design. For each of the plurality of copies of the pattern, the computing device may be configured to modify a load value according to the defect location assumed for the copied pattern. The computing device may be configured to obtain one or more diagnosis scores for each of the plurality of defect locations, identify at least one flop having a low diagnosis score, and eliminate the at least one flop from a simulation. In some embodiments, simulating may include all defect locations associated with the electronic design. The computing device may be configured to select a second sliced failing pattern set and generate a second plurality of copies of a pattern associated with the second sliced failing pattern set and to simulate the second plurality of copies of the pattern in parallel. The computing device may be configured to obtain one or more simulation scores and identify a defect location based upon, at least in part, a maximum score.

Additional features and advantages of embodiments of the present disclosure may be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

FIGS. 7A-B illustrate examples of parallel pattern simulation in according to some embodiments;

FIG. 9 is a diagram depicting results according to some embodiments

DETAILED DESCRIPTION OF THE EMBODIMENTS

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

The following description is presented to enable any person skilled in the art to create and use a computer system configuration and related method and article of manufacture to perform efficient scan chain diagnosis using a parallel pattern simulation. Embodiments included herein provide a new technique for faster convergence of defect location by improving the efficiency of simulation process and searching process. Embodiments described herein may be configured to simulate a large number of defect locations in a single simulation iteration as opposed to the current approach of simulating a single defect location. Embodiments may also allow for simulation and searching to be performed in a more exhaustive manner resulting in improved accuracy. The proposed solutions results in a faster and a more accurate chain diagnosis. Various modifications to the embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the embodiments of the present disclosure might be practiced without the use of these specific details. In other instances, well-known structures and processes are shown in block diagram form in order not to obscure the description of the invention with unnecessary detail. Thus, the present disclosure is not intended to be limited to the embodiments shown, but is to be accorded the widest scope consistent with the principles and features disclosed herein.

An IC may include at least two types of structures—scan chain(s) and combinational logic. A scan chain comprises a design for test (DFT) structure included in the IC design (and which is included in the corresponding manufactured IC) for purposes of facilitating detection of IC hardware defect. A scan chain may include, for example, flip flops (or other sequential devices) serially connected to each other, the output of a proceeding flip flop being the input of the next flip flop in the series.

Figure 1:
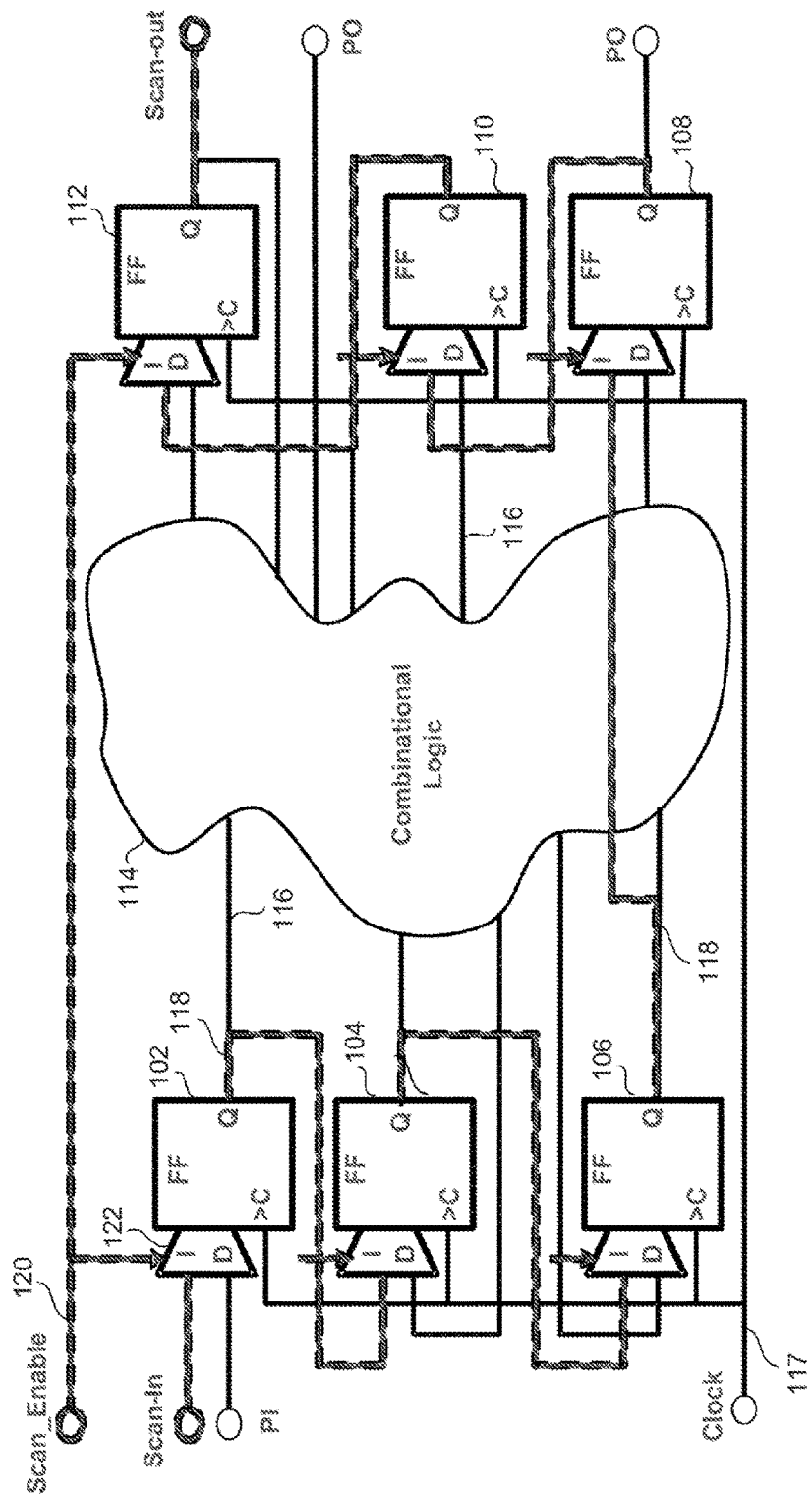
FIG. 1 illustrates an example portion of an integrated circuit (IC) according to some embodiments.

FIG. 1 illustrates an example portion of an IC 100 according to some embodiments. The IC 100 includes flip flops 102, 104, 106, 108, 110, 112 and combinational logic 114. In functional mode, the flip flops 102, 104, 106, 108, 110, 112 in combination with the combinational logic 114 comprise functional circuitry, shown in FIG. 1 as functional connections or pathways 116 (solid line). Combinational logic 114 may include, but is not limited to, resisters, transistors, diodes, capacitors, etc. When in scan mode, the flip flops 102, 104, 106, 108, 110, 112 may include the scan chain 118, shown in FIG. 1 as dotted lines. All of the flip flops 102, 104, 106, 108, 110, 112 are tied to a common clock line 117 for both functional and scan modes.

For each of the flip flops 102, 104, 106, 108, 110, 112, a multiplexer 122 may be connected to its data input line. The multiplexer 122 may be configured to permit its respective flip flop to operate in functional mode and in scan mode. The multiplexer 122, for example, can be a 2:1 multiplexer. As shown in FIG. 1, an input denoted as "D" in the multiplexer 122 is the data-in line for a given flip flop operating in functional mode. An input denoted as "I" in the multiplexer 122 is the data-in line for a given flip flop operating in scan mode.

The scan chain 118 may include the flip flops 102, 104, 106, 108, 110, 112 daisy chained together in the following order: the output of flip flop 102 is the input to flip flop 104, the output of flip flop 104 is the input to flip flop 106, the output of flip flop 106 is the input to flip flop 108, the output of flip flop 108 is the input to flip flop 110, and the output of flip flop 110 is the input to flip flop 112. The input of flip flop 102 may be referred to as a scan-in line and it is where the test pattern (generated by a test pattern generator) is applied. The output of flip flop 112 may be referred to as a scan-out line and it is where the unload pattern (corresponding to the inputted test pattern) is read out. All of the flip flops in the scan chain 118 are tied to a scan-enable line (via the multiplexer 122). A scan-enable test control signal is applied to the scan-enable line to place flip flops 102, 104, 106, 108, 110, 112 in the scan mode or state.

Each of the flip flops 102, 104, 106, 108, 110, 112 represents a bit position. When a scan chain, such as the scan chain 118, is tested, the test pattern shifts one bit position per clock cycle. The clock may be pulsed the same number of times as the (bit) length of the scan chain. At the completion of this operation, the inputted test pattern (also referred to as stimulus data) may have loaded in each and every flip flop of the scan chain.

One or more scan chains may be included in the IC 100. Each scan chain may also be the same or different length from each other (e.g., a scan chain may contain a different number of flip flops from another scan chain, the flip flops of a scan chain may be more dispersed in the IC than the flip flops of another scan chain, etc.). A flip flop included in the IC 100 can be part of one or more scan chains. A flip flop included in the IC 100 can also be part of one or more functional circuitry.

The IC 100 may be packaged in a chip that includes pins. The pins serve as the input and output interfaces for the chip. Two pins are associated with each scan chain included in the IC 100—an input pin coupled to the scan-in line of a scan chain and an output pin coupled to the scan-out line of the scan chain. For this reason, the number of scan chains in an IC chip may be limited by the number of pins that may be provided for scan chains. During the scan test, to be discussed in detail below, a test pattern is inputted to the input pins of the scan chains and the outputs of the corresponding output pins of the scan chains provide the unload patterns.

Figure 2:
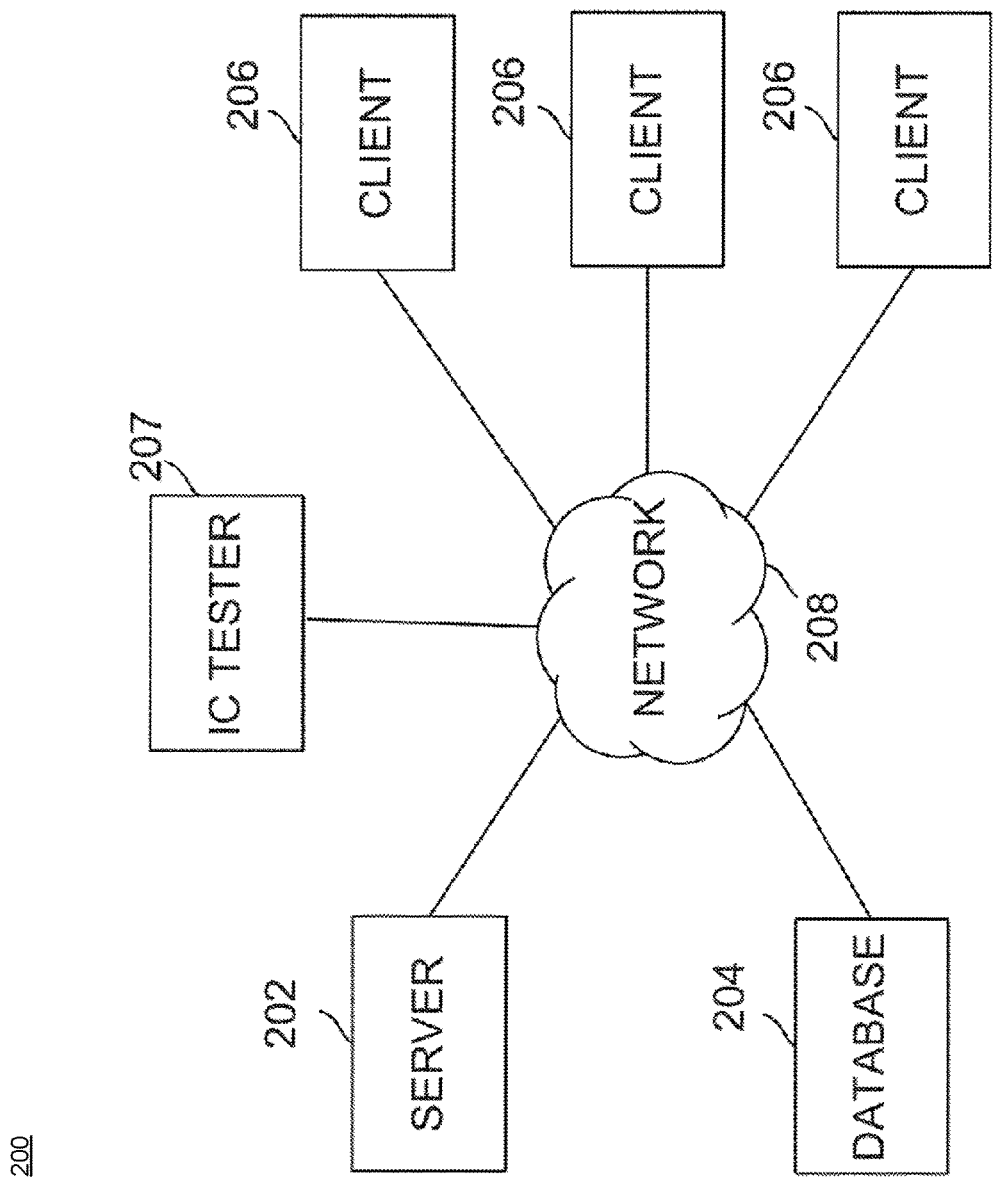
FIG. 2 illustrates an example system for providing scan test and scan diagnostic tools according to some embodiments.

FIG. 2 illustrates an example system 200 for providing scan test and scan diagnostic tools according to some embodiments. System 200 includes a server 202, a database 204, one or more clients 206, an IC tester 207, and a network 208. Each of server 202, database 204, clients 206, and IC tester 207 is in communication with network 208.

Server 202 may include one or more computers or processors configured to communicate with clients 206 via network 208. Server 202 may be located at one or more geographically distributed locations. Server 202 hosts one or more applications accessed by clients 206 or IC tester 207, and/or facilitates access to the content of database 204. Database 204 comprises one or more databases configured to communicate with server 202, clients 206, and/or IC tester 207 via network 208. Although not shown, database 204 may also communicate with server 202 or IC tester 207 without needing network 208. Database 204 may be located at one or more geographically distributed locations from each other and also from server 202. Alternatively, database 204 may be included within server 202. Database 204 may include a storage device for storing data and/or instructions for use by server 202, clients 206, and/or IC tester 207.

Each of clients 206 may include a computer or other computing device, including but not limited to, work stations, personal computers, general purpose computers, Internet appliances, hand-held devices, wireless devices, portable devices, wearable computers, cellular or mobile phones, portable digital assistants (PDAs), smart phones, multi-processor systems, microprocessor-based or programmable consumer electronics, game consoles, set-top boxes, network PCs, mini-computers, etc. Clients 206 may include applications (e.g., web browser application such as Internet Explorer, Firefox, Safari, etc.) or other necessary interface capabilities to communicate with server 202, database 204, and/or IC tester 207 via network 208. Clients 206 may be located geographically dispersed from each other, server 202, IC tester 207, and/or database 204. Although three clients 206 are shown in FIG. 2, more or less than three clients may be included in system 200. IC testing personnel access the testing environment including access to the scan diagnostic tool via clients 206.

IC tester 207 may include IC chip testing equipment configured to conduct scan tests on IC chips. The IC tester 207 includes pin connection locations to establish electrical contact with the pins of the IC chip being tested. The IC tester 207 also includes various components to conduct the scan tests such as, but not limited to, input source(s), output data capture devices, controller, etc. In one embodiment, the IC tester 207 may be configured to automatically input pre-determined test patterns to each IC chip being tested, to obtain the unload patterns corresponding to the inputted test patterns, and to save the obtained unload patterns in association with an unique identifier of the IC chip tested (e.g., save in the database 204). In another embodiment, the IC tester 207 may be configured to receive scan testing instructions (e.g., test pattern(s) to apply to the IC chip being tested) from server 202 or clients 206, and to conduct the scan tests in response to the received instructions. The chips may be physically located at the IC tester 207, while the specification of the test inputs and processing of the test results occur elsewhere, such as at server 202 or clients 206. Although a single IC tester 207 is shown in FIG. 2, one or more IC testers may be included in system 200. For example, more than one IC tester may be used to simultaneously test a plurality of IC chips.

In some embodiments, IC tester 207 may be a standalone station not connected to a network. In this case, database 204 (or similar functionality) may be included in the IC tester 207 to provide information to conduct the scan test. In yet another alternative, the scan test tool (or parts of the scan test tool) may be implemented on a peer-to-peer network rather than the server-client model shown in FIG. 2.

Network 208 may include a communications network, such as a local area network (LAN), a wireless LAN (WLAN), a wide area network (WAN), a wireless WAN (WWAN), a metropolitan area network (MAN), an ad hoc network, an intranet, an extranet, a virtual private network (VPN), a portion of the Internet, the Internet, a portion of a public switched telephone network (PSTN), a cellular network, or a combination of two or more such networks. When network 208 comprises a public network, security features (e.g., VPN/SSL secure transport) may be included to ensure authorized access within system 200.

The testing environment capable of providing the scan diagnostic tool may be hosted by one or more components within system 200. In one embodiment, the scan diagnostic tool may be hosted on server 202 and may be remotely accessed by clients 206 via network 208. In another embodiment, the tool may reside locally on clients 206. Server 202 may be involved for purposes of updating and/or monitoring the tool on clients 106, and/or to facilitate interaction with database 204 by clients 206. In still another embodiment, a portion of the tool may reside at server 202 and another portion of the tool may reside at clients 206.

In some embodiments, clients 206 may be standalone stations not connected to a network. In this case, database 204 (or similar functionality) may be included in clients 206 to provide information used by the tool, as described in detail below. In yet another alternative, the tool may be implemented on a peer-to-peer network rather than the server-client model shown in FIG. 2.

In one embodiment, the scan diagnostic tool described herein may be implemented as part of a larger simulator (a simulation product or service) that may be capable of running different types of simulations and/or part of a larger chip tester (a testing product or service). For example, the simulator may be configured to perform the circuit simulations involved in scan diagnosis as described below. In another embodiment, the scan diagnosis may be implemented as a tool separate from the simulator and physical chip tester. In this case, the tool includes code to model the circuit (or is otherwise able to obtain the modeling information from another source such as the simulator), IC design specifications, scan test results (the unload patterns and associated scan chain data), and/or other information necessary to perform scan diagnosis.

Figure 3:
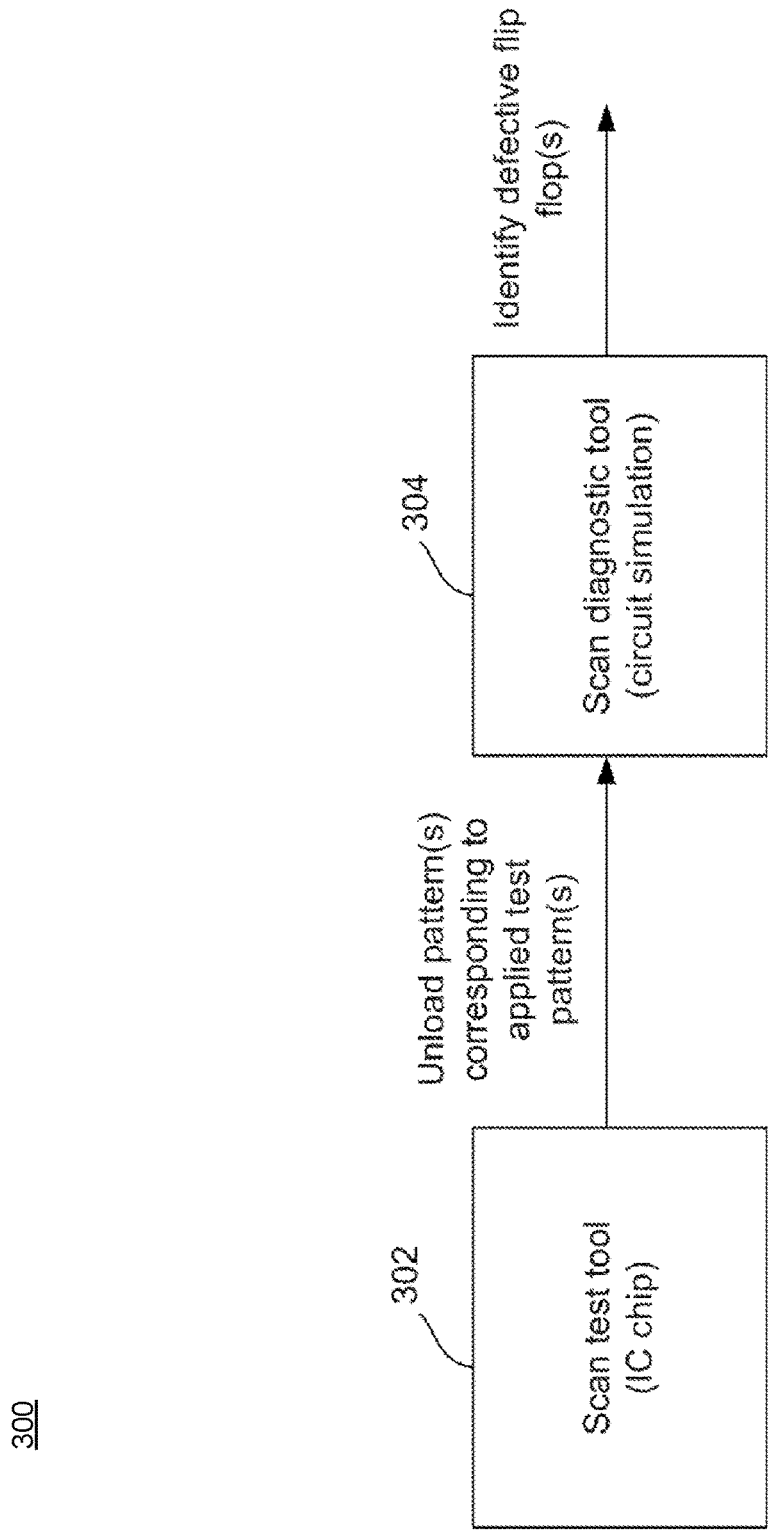
FIG. 3 illustrates an example block diagram showing the interaction between the scan testing and scan diagnostic tools according to some embodiments.

FIG. 3 illustrates an example block diagram showing the interaction between the scan testing and scan diagnostic tools according to some embodiments. A scan test tool 302 is configured to conduct a scan test on a manufactured IC chip as described in detail below. The scan test tool 302 (also referred to as a scan chain test tool or scan integrity test tool) applies one or more load patterns (also referred to as test patterns) to each scan chain of the manufactured IC chip. The scan test tool 302 also obtains an unload pattern (also referred to as a result or resultant pattern) for each applied load pattern from the manufactured IC chip. Next, a scan diagnostic tool 304 may be configured to effectuate parallel pattern simulation as described in detail below.

Figure 4:
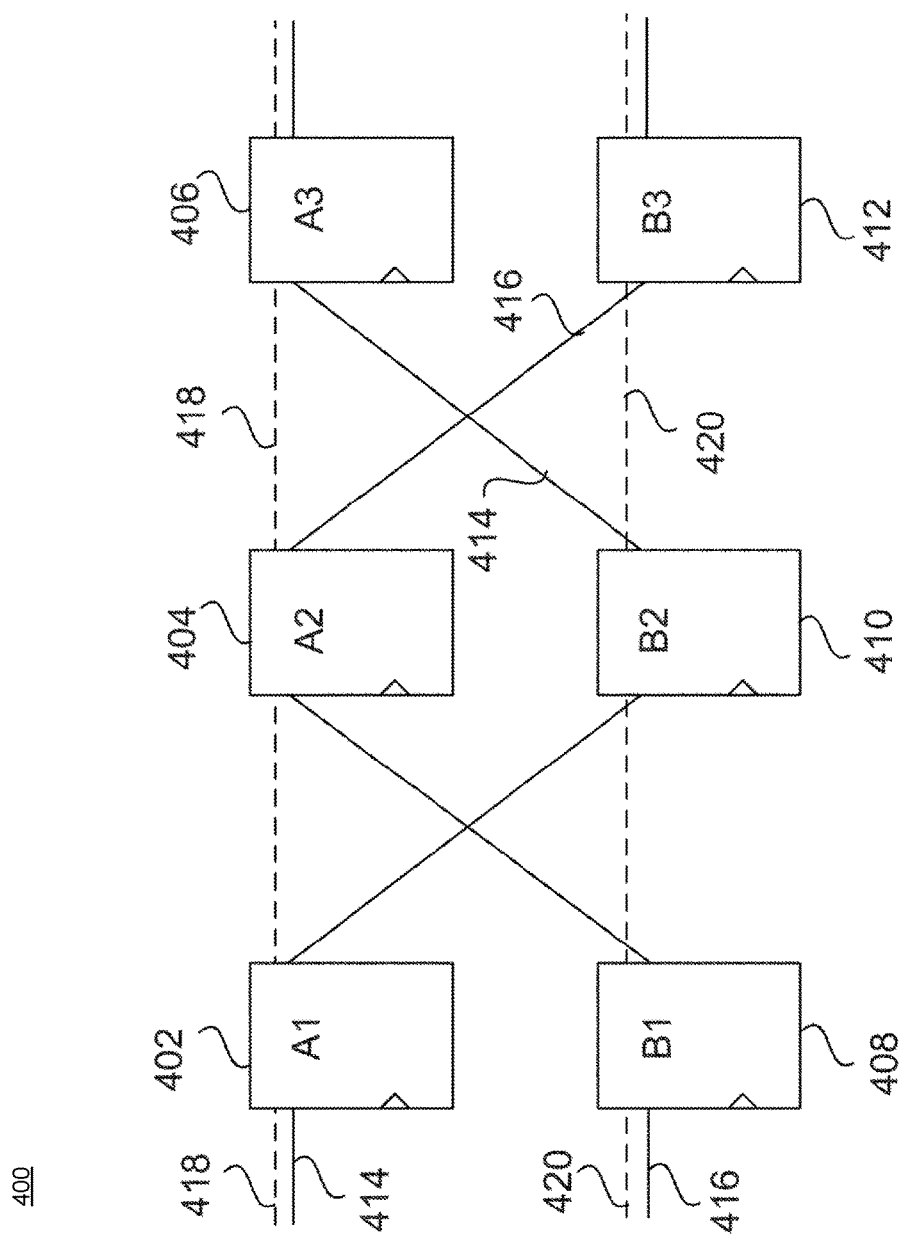
FIG. 4 illustrates an example plurality of flip flops included in an IC chip according to some embodiments.

FIG. 4 illustrates an example plurality of flip flops 400 included in an IC chip according to some embodiments. The flip flops 400 and surrounding circuitry are shown simplified for ease of illustration. For example, the multiplexer for each flip flop has been omitted for ease of illustration. The plurality of flip flops 400 comprises (portions of) scan chains and functional logic or circuitry. In particular, a first functional logic/circuitry 418 includes flip flops 402, 404, and 406. A second functional logic/circuitry 420 includes flip flops 408, 410, 412. First and second functional logic/circuitry 418, 420 also includes combinational logic, which is not shown for ease of illustration. Although not shown, one or more devices (e.g., resisters, capacitors, diodes, transistors, etc.) can be included between flip flops 402 and 404, flip flops 404 and 406, flip flops 408 and 410, and/or flip flops 410 and 412. A first scan chain 414 includes flip flops 402, 410, and 406. A second scan chain 416 includes flip flips 408, 404, and 412.

It is understood that although flip flops 402, 404, 406, 408, 410, 412 are shown next to each other, one or more of these flip flops may be distally located from each other. For example, flip flop 402 may be physically located within a top left quadrant of the IC chip, flip flop 410 may be physically located within a top right quadrant of the IC chip, and flip flop 406 may be physically located within a bottom right quadrant of the IC chip. It is also understood that the IC chip may include more flip flops than shown in FIG. 4. For example, an IC chip can include tens of thousands of flip flops, more or less than two scan chains, and/or more or less than two functional logic/circuitry pathways. In some embodiments, the output of the scan test tool 302 may be considered to be pre-curser data to facilitate the scan diagnostic tool 304.

As discussed above, chain diagnosis generally involves two steps. First, a defect may be injected at a flip flop and a simulation may be performed on failing patterns and compare simulation results with tester results. This step may then be repeated at various flops in the chain using a heuristic based search algorithm until a best scoring flop is determined. However, the simulation process is expensive and takes a long time. If multiple chains are failing, the number of simulations to be performed will increase drastically.

Accordingly, embodiments of the present disclosure proposes a new technique for faster convergence of defect location by improving the efficiency of simulation process and searching process. The parallel pattern simulation process described herein may be configured to simulate a large number of defect locations in a single simulation iteration as opposed to current approaches that involve simulating a single defect location. Embodiments included herein may also allow for simulation and searching to be performed in a more exhaustive manner resulting in improved accuracy and faster chain diagnosis.

Figure 5:
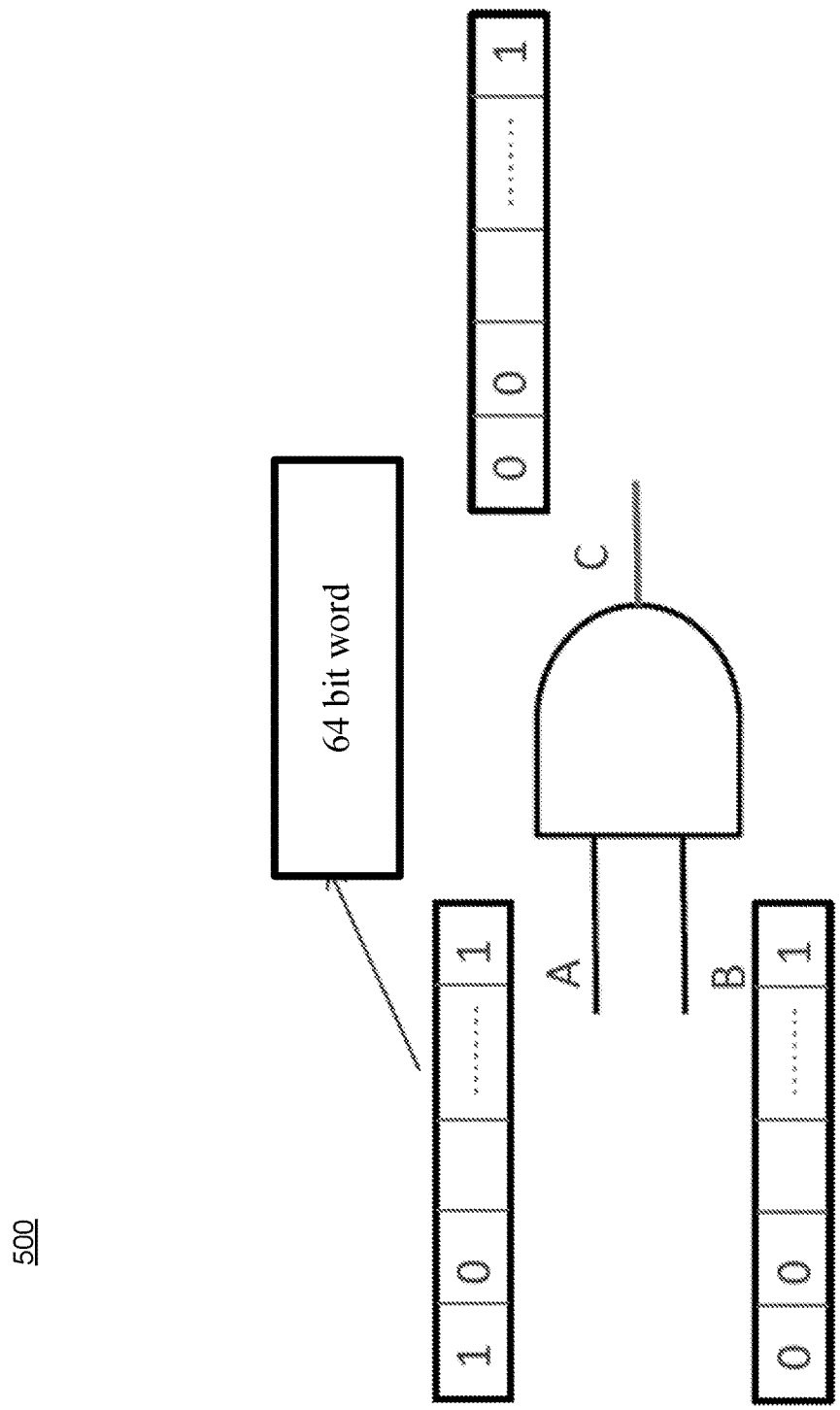
FIG. 5 illustrates an example of parallel pattern simulation in according to some embodiments.

Referring now to FIG. 5 a diagram 500 consistent with an embodiment of the parallel pattern simulation process is provided. In some embodiments, a fault simulator may be configured to support a Parallel Pattern Single Fault Propagation style of simulation. In this approach, a machine word size data (e.g., usually 64 bits) may be maintained at every node. Each bit may hold the value of the node for the pattern associated with the bit index. With this technique, many patterns may be simulated in parallel resulting in high performance.

As discussed above and shown in FIG. 5, in some embodiments, at each node in the design, data of the size of the machine word may be stored. Each bit in a machine word may contain the value of the node in a pattern. For example, if the machine word size is 8 bytes (e.g., 64 bits), values from 64 patterns may be available at every node. In this way, simulation of 64 patterns in a single iteration may be performed. In the example provided in FIG. 5, values at Pin C may be ANDed with values of Pin A and Pin B values from 64 patterns. For example, in a four valued simulation, two machine words may be stored at every node to save the information of 1, 0, X and Z at each node.

Figure 6:
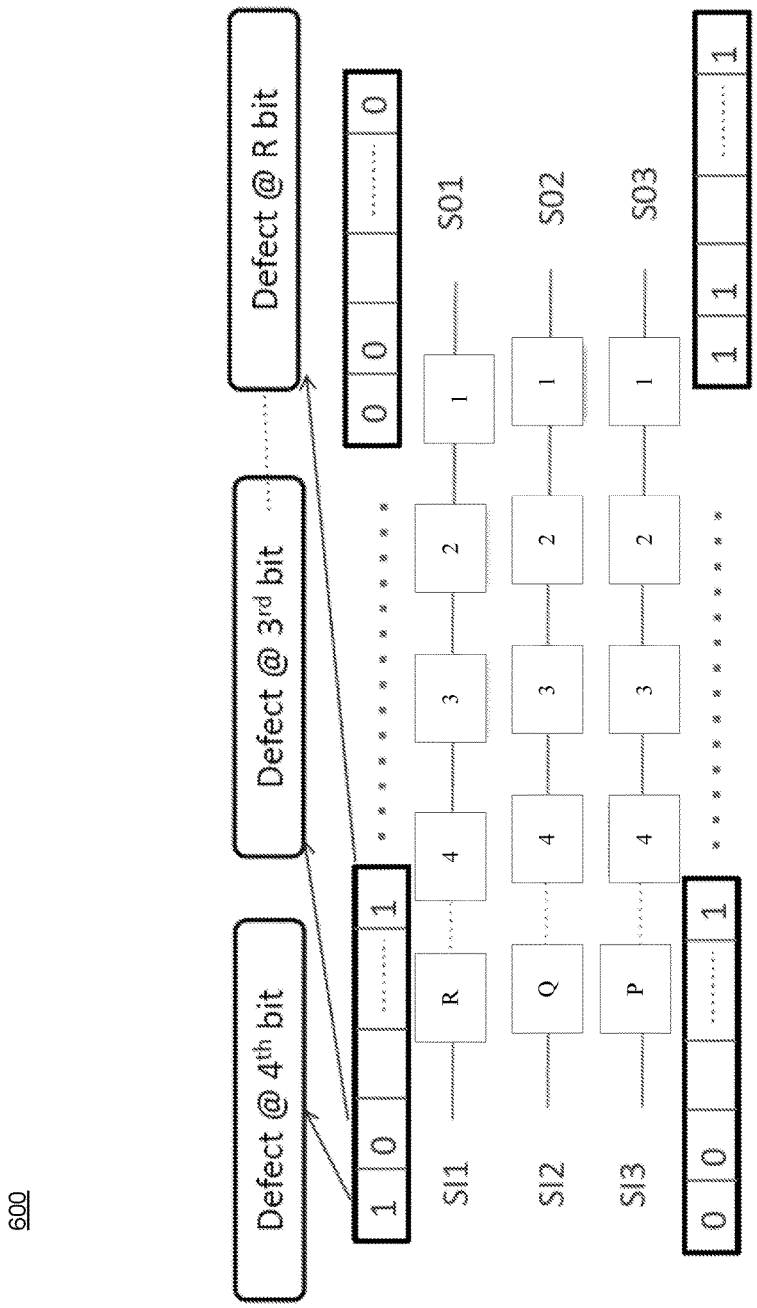
FIG. 6 illustrates an example of parallel pattern simulation in according to some embodiments.

Referring also to FIG. 6, another embodiment depicting an example 600 consistent with parallel pattern simulation process is provided. Chain diagnosis involves a series of modified simulations each assuming a defect location. The simulation results of the modified patterns may be compared with tester results and a score is determined. Embodiments of the parallel pattern simulation process described herein may use parallel pattern simulation in chain diagnosis in an efficient manner such that the performance and accuracy of diagnosis results are improved. Instead of assuming a single defect location, a large number of defect locations are assumed and the existing patterns are copied multiple times and each copy of the patterns are modified according to the assumed defect location.

In operation, and as shown in FIG. 6, the process may include selecting a failing pattern 'P' and generating 'K' copies of the failing pattern where 'K' is the number of patterns that could be simulated in parallel. In some embodiments assume 'K' defect locations in the failing scan chain (s). The process may be configured to modify each copy of a failing pattern according to the defect behavior of the failing location considered for this copied pattern. Accordingly, the process may be configured to simulate 'K' defect locations in one iteration and obtain diagnosis scores for the selected failing pattern 'P'.

Figures 7A, 7B:
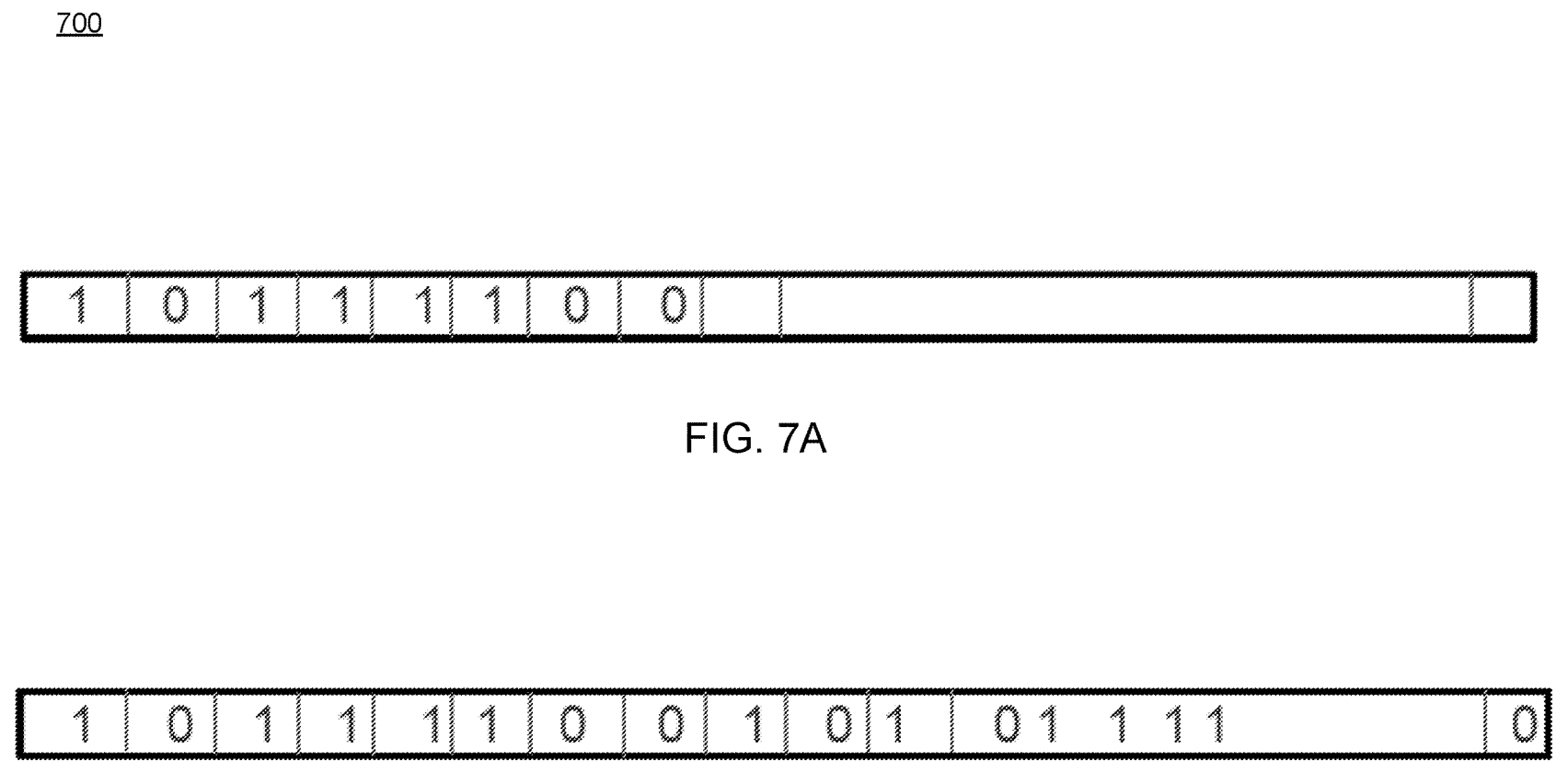

Referring now to FIGS. 7A-B, another embodiment depicting an example 700 consistent with parallel pattern simulation process is provided. In chain diagnosis, failure data for 8-10 patterns is usually collected since the number of failures logged for chain fails is huge. For example purposes, assume that eight patterns are simulated assuming a single defect location. At the end of a simulation iteration, diagnosis results for just one defect location are obtained as shown in FIG. 7A. If these eight patterns are copied over eight times, sixty-four patterns may be simulated assuming eight defect locations, at the end of the same simulation iteration, diagnosis results for eight defect locations are obtained resulting in faster diagnosis as shown in FIG. 7B.

If the approach is slightly modified to perform simulation of one failing pattern at a time, sixty-four defect locations may be assumed and diagnosis scores for sixty-four defect locations could be obtained at the end of the simulation iteration. All those defect locations that show very poor scores need not be simulated on the remaining failing patterns and the performance could be further improved. In other words, the quality of diagnosis depends on the number of possible defect locations simulated and how close these locations are to the actual defect location. Embodiments included herein provide an approach that may include slicing the failing patterns and performing faster searches through simulation of large number of defect locations.

Figure 8:
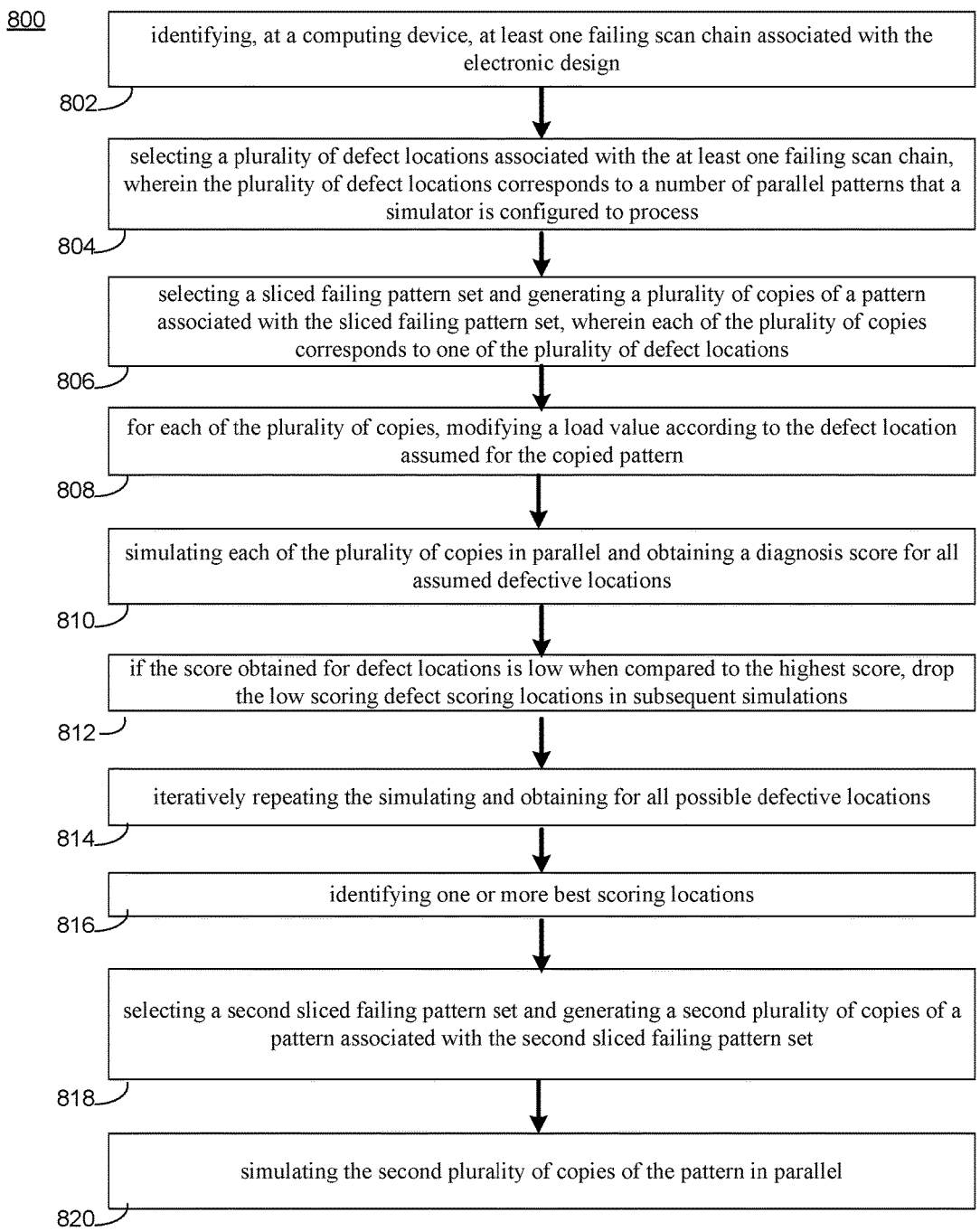
FIG. 8 is a flowchart depicting operations consistent with embodiments of parallel pattern simulation process described herein.

In operation, and referring also to FIG. 8, embodiments of parallel pattern simulation process may include one or more operations, examples of which are provided below. Embodiments may include identifying (802), at a computing device, at least one failing scan chain associated with the electronic design and selecting (804) a plurality of defect locations associated with the at least one failing scan chain, wherein the plurality of defect locations corresponds to a number of parallel patterns that a simulator is configured to process. The method may further include selecting (806) a sliced failing pattern set and generating a plurality of copies of a pattern associated with the sliced failing pattern set, wherein each of the plurality of copies corresponds to one of the plurality of defect locations. For each of the plurality of copies, the method may include modifying (808) a load value according to the defect location assumed for the copied pattern. The method may also include simulating (810) each of the plurality of copies in parallel and obtaining a diagnosis score for all assumed defective locations. If the score obtained for defect locations is low when compared to the highest score, the method may include dropping (812) the low scoring defect scoring locations in subsequent simulations. The method may also include iteratively repeating (814) the simulating and obtaining for all possible defective locations. The method may further include identifying (816) one or more best scoring locations, selecting (818) a second sliced failing pattern set and generating a second plurality of copies of a pattern associated with the second sliced failing pattern set. The method may include simulating (820) the second plurality of copies of the pattern in parallel.

In some embodiments, in the new approach, a slice of failing patterns (usually 1) is selected. Now, simulation occurs on 'K' defect locations (e.g., 64 for 1 failing pattern) and the search process continues until a list of best possible defect locations are identified for the selected patterns. Simulation of subsequent slices of failing patterns may focus on the pruned list in previous simulations and determine a new and smaller list of failing locations.

More specifically, in some embodiments, the process may include selecting (step 1) 'K' defect locations on the failing scan chain(s). Here, 'K' may refer to the number of parallel patterns that may be simulated by a simulator. The process may further include selecting a sliced failing pattern set 'P' and generating 'K' copies of this pattern (step 2). Each copied pattern may be associated with a defect location selected. The selected failing pattern set 'P' could be a subset of all the failing patterns.

For each copied pattern, the process may include modifying the load values according to the defect location assumed for this copied pattern (step 3). The copied patterns may be simulated in parallel and the diagnosis scores may be obtained for all the assumed defective locations (step 4). In some embodiments, step 4 may be repeated for all possible defective locations. The process may include dropping the locations with poor scores and accumulating the best scoring locations for Step 6 and Step 7, which are described in further detail below.

In some embodiments, the process may include selecting (step 6) the next slice of failing patterns and repeating steps 1-5 on a pruned list of possible defective locations identified in Step 5. In step 7, the best failing locations across various simulation slices should overlap and the actual defect location should score the maximum. If top scoring locations vary across the searches, perform an independent simulation on these locations and determine the best scoring location. In some embodiments, the "steps" identified above may be implemented in numerical order, however, it should be noted that this is merely in an embodiment of the present disclosure and that other embodiments are also contemplated.

As is shown in FIG. 9, the experiments conducted by injecting various faults have shown significant increase in performance with a better accuracy. For example, the number of simulations performed in the new approach reduced drastically and the new approach resulted in highly accurate results (e.g., the top score improved to 99.3 when compared to 98.4 with existing solution) when the defect type is intermittent in nature.

Accordingly, embodiments of the parallel pattern simulation process described herein may provide numerous advantages over existing techniques. Some of these may include, but are not limited to, the simulator's ability to simulate patterns in parallel is fully leveraged. Additionally and/or alternatively, low scoring flops may be eliminated from the search in early stages of simulation resulting in significant performance improvement. Embodiments of the present disclosure may also generate high accuracy results. In previous approaches, a small number of possible defective locations are simulated with all failing patterns and it is quite possible the actual defect location may not be even simulated. In contrast, using the teachings of the present disclosure, since the failing patterns are sliced and simulated, more simulation time is spent on a larger range of flops with a far higher probability of finding the defect.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for performing scan chain diagnosis of an electronic design comprising:
   manufacturing an integrated circuit having one or more scan chains included therein;
   identifying, at a computing device, at least one failing scan chain associated with the integrated circuit;
   selecting a plurality of defect locations associated with the at least one failing scan chain, wherein the plurality of defect locations corresponds to a number of parallel patterns that a simulator is configured to process;
   selecting a sliced failing pattern set and generating a plurality of copies of a pattern associated with the sliced failing pattern set, wherein each of the plurality of copies corresponds to one of the plurality of defect locations;
   for each of the plurality of copies, modifying a load value according to the defect location assumed for the copied pattern;
   simulating each of the plurality of copies in parallel and obtaining a diagnosis score for all assumed defective locations;
   eliminating at least one flop having a low diagnosis score from the simulation prior to completing the simulation;
   iteratively repeating the simulating and obtaining the diagnosis score for all possible defective locations;
   identifying one or more best scoring locations;
   selecting a second sliced failing pattern set and generating a second plurality of copies of a pattern associated with the second sliced failing pattern set; and
   simulating the second plurality of copies of the pattern in parallel to diagnose one or more defective locations in the integrated circuit.

2. The method of claim 1, wherein the selected sliced failing pattern set is a subset of all failing patterns of the electronic design.

3. The method of claim 1, wherein iteratively repeating simulating and obtaining generates a pruned list of possible defective locations.

4. The method of claim 1, further comprising:
   storing machine word size data at each node of the electronic design, wherein each bit in a machine word includes a value of a node in a pattern.

5. A method for performing scan chain diagnosis of an electronic design comprising:
   manufacturing an integrated circuit having one or more scan chains included therein;
   identifying, at a computing device, at least one failing scan chain associated with the integrated circuit;
   selecting a plurality of defect locations associated with the at least one failing scan chain, wherein the plurality of defect locations corresponds to a number of parallel patterns that a simulator is configured to process;
   selecting a sliced failing pattern set and generating a plurality of copies of a pattern associated with the sliced failing pattern set, wherein each of the plurality of copies corresponds to one of the plurality of defect locations;
   simulating the plurality of copies of the pattern in parallel to diagnose one or more defective locations in the integrated circuit;
   obtaining one or more diagnosis scores for each of the plurality of defect locations; and
   eliminating at least one flop having a low diagnosis score from the simulation prior to completing the simulation.

6. The method of claim 5, further comprising:
   storing machine word size data at each node of an electronic design, wherein each bit in a machine word includes a value of a node in a pattern.

7. The method of claim 5, wherein the selected sliced failing pattern set is a subset of all failing patterns of the electronic design.

8. The method of claim 5, further comprising:
   for each of the plurality of copies of the pattern, modifying a load value according to the defect location assumed for the copied pattern.

9. The method of claim 8, wherein simulating includes all defect locations associated with the electronic design.

10. The method of claim 9, further comprising:
    selecting a second sliced failing pattern set and generating a second plurality of copies of a pattern associated with the second sliced failing pattern set; and
    simulating the second plurality of copies of the pattern in parallel.

11. The method of claim 10, further comprising:
    obtaining one or more simulation scores and identifying a defect location based upon, at least in part, a maximum score.

12. A system for performing scan chain diagnosis of an electronic design comprising:

an integrated circuit having one or more scan chains included therein;
integrated circuit chip testing equipment configured to:
identify at least one failing scan chain associated with the electronic design;
select a plurality of defect locations associated with the at least one failing scan chain, wherein the plurality of defect locations corresponds to a number of parallel patterns that a simulator is configured to process;
select a sliced failing pattern set and generate a plurality of copies of a pattern associated with the sliced failing pattern set, wherein each of the plurality of copies corresponds to one of the plurality of defect locations;
simulate the plurality of copies of the pattern in parallel to diagnose one or more defective locations in the integrated circuit;
obtain one or more diagnosis scores for each of the plurality of defect locations; and
eliminate at least one flop having a low diagnosis score from the simulation prior to completing the simulation.

13. The system of claim 12, wherein the computing device is configured to store machine word size data at each node of an electronic design, wherein each bit in a machine word includes a value of a node in a pattern.

14. The system of claim 12, wherein the selected sliced failing pattern set is a subset of all failing patterns of the electronic design.

15. The system of claim 12, wherein the computing device is configured to:
for each of the plurality of copies of the pattern, modify a load value according to the defect location assumed for the copied pattern.

16. The system of claim 15, wherein simulating includes all defect locations associated with the electronic design.

17. The system of claim 16, wherein the computing device is configured to:
select a second sliced failing pattern set and generate a second plurality of copies of a pattern associated with the second sliced failing pattern set; and
simulate the second plurality of copies of the pattern in parallel.

18. The system of claim 17, wherein the computing device is configured to:
obtain one or more simulation scores and identify a defect location based upon, at least in part, a maximum score.

* * * * *